United States Patent
Sonawane et al.

(10) Patent No.: US 10,545,189 B2
(45) Date of Patent: Jan. 28, 2020

(54) GRANULAR DYNAMIC TEST SYSTEMS AND METHODS

(71) Applicant: NVIDIA CORPORATION, Santa Clara, CA (US)

(72) Inventors: Milind Sonawane, San Jose, CA (US); Amit Sanghani, San Jose, CA (US); Jonathon E. Colburn, Ben Lomond, CA (US); Bala Tarun Nelapatla, Milpitas, CA (US); Shantanu Sarangi, Saratoga, CA (US); Rajendra Kumar reddy.S, Bangalore (IN); Sailendra Chadalavada, Milpitas, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 390 days.

(21) Appl. No.: 15/336,716

(22) Filed: Oct. 27, 2016

(65) Prior Publication Data

US 2017/0115353 A1 Apr. 27, 2017

Related U.S. Application Data

(60) Provisional application No. 62/247,195, filed on Oct. 27, 2015, provisional application No. 62/285,429, filed on Oct. 27, 2015.

(51) Int. Cl.
*G01R 31/3177* (2006.01)
*G01R 31/26* (2014.01)
(Continued)

(52) U.S. Cl.
CPC ..... *G01R 31/3177* (2013.01); *G01R 31/2607* (2013.01); *G01R 31/2803* (2013.01);
(Continued)

(58) Field of Classification Search
CPC ............ G01R 31/3177; G01R 31/2607; G01R 31/2803; G01R 31/2806; G01R 31/2834;
(Continued)

(56) References Cited

U.S. PATENT DOCUMENTS 5,535,331 A 7/1996 Swoboda et al.
5,656,963 A 8/1997 Masleid et al.
(Continued)

*Primary Examiner* — John J Tabone, Jr.
(74) *Attorney, Agent, or Firm* — Zilka-Kotab, P.C.

(57) ABSTRACT

In one embodiments, a system comprises: a plurality of scan test chains configured to perform test operations at a first clock speed; a central test controller for controlling testing by the scan test chains; and an interface configured to generate instructions to direct central test controller. The interface communicates with the centralized test controller at the first clock speed and an external scan input at a second clock speed. The second clock speed can be faster than the first clock speed. The instructions communicated to the central controller can be directions associated with sequential scan compression/decompression operations. In one exemplary implementation, the interface further comprise a mode state machine used to generate the mode control instructions and a test register state machine that generate test state control instructions, wherein the test mode control instructions and the test state control instructions direct operations of the centralized test controller.

25 Claims, 12 Drawing Sheets

(51) Int. Cl.
*G01R 31/3185* (2006.01)
*G06F 11/00* (2006.01)
*G01R 31/317* (2006.01)
*G01R 31/28* (2006.01)

(52) U.S. Cl.
CPC ..... *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G01R 31/318572* (2013.01); *G06F 11/00* (2013.01)

(58) Field of Classification Search
CPC ........ G01R 31/31701; G01R 31/31707; G01R 31/31724; G01R 31/31725; G01R 31/318555; G01R 31/318572; G06F 11/00
USPC .................. 714/727, 726, 729, 731
See application file for complete search history.

(56) References Cited

U.S. PATENT DOCUMENTS

| | | | |
|---|---|---|---|
| 5,682,391 A * | 10/1997 | Narayanan | G01R 31/318572 714/731 |
| 5,805,608 A | 9/1998 | Baeg et al. | |
| 5,812,562 A * | 9/1998 | Baeg | G01R 31/318552 714/726 |
| 5,970,241 A | 10/1999 | Deao et al. | |
| 6,016,555 A | 1/2000 | Deao et al. | |
| 6,023,778 A * | 2/2000 | Li | G01R 31/31858 714/726 |
| 6,055,649 A | 4/2000 | Deao et al. | |
| 6,065,106 A | 5/2000 | Deao et al. | |
| 6,081,885 A | 6/2000 | Deao et al. | |
| 6,106,568 A | 8/2000 | Beausang et al. | |
| 6,112,298 A | 8/2000 | Deao et al. | |
| 6,163,583 A * | 12/2000 | Lin | G06F 1/08 375/354 |
| 6,192,092 B1 | 2/2001 | Dizon et al. | |
| 6,343,365 B1 * | 1/2002 | Matsuzawa | G01R 31/318558 365/201 |
| 6,473,439 B1 | 10/2002 | Zerbe et al. | |
| 6,493,802 B1 * | 12/2002 | Razdan | G06F 12/0806 711/141 |
| 6,586,921 B1 | 7/2003 | Sunter | |
| 6,622,255 B1 | 9/2003 | Kurd et al. | |
| 6,724,328 B1 | 4/2004 | Lui et al. | |
| 6,763,485 B2 | 7/2004 | Whetsel | |
| 6,785,856 B1 * | 8/2004 | Parker | G11C 29/12015 714/734 |
| 6,813,739 B1 | 11/2004 | Grannis, III | |
| 6,949,958 B2 | 9/2005 | Zerbe et al. | |
| 7,015,741 B2 | 3/2006 | Tschanz et al. | |
| 7,046,174 B1 | 5/2006 | Lui et al. | |
| 7,093,150 B1 | 8/2006 | Norman et al. | |
| 7,245,684 B2 | 7/2007 | Adkisson | |
| 7,266,742 B1 * | 9/2007 | Pandey | G01R 31/318577 714/726 |
| 7,288,973 B2 | 10/2007 | Zerbe et al. | |
| 7,409,612 B2 | 8/2008 | Van De Logt et al. | |
| 7,447,961 B2 | 11/2008 | Tan | |
| 7,484,076 B1 * | 1/2009 | Oberman | G06F 9/30105 712/203 |
| 7,509,549 B2 | 3/2009 | Larson et al. | |
| 7,613,967 B2 | 11/2009 | Tan | |
| 7,831,856 B1 | 11/2010 | Liu et al. | |
| 7,984,369 B2 | 7/2011 | Sul et al. | |
| 7,987,401 B2 * | 7/2011 | Pandey | G01R 31/318594 714/727 |
| 8,112,654 B2 | 2/2012 | Bjerregaard | |
| 8,205,182 B1 | 6/2012 | Zlatanovici et al. | |
| 8,438,437 B2 * | 5/2013 | Jain | G01R 31/318547 714/726 |
| 8,694,844 B2 | 4/2014 | Whetsel | |
| 8,887,117 B1 | 11/2014 | Chuang | |
| 9,103,879 B2 | 8/2015 | Douskey et al. | |
| 9,116,205 B2 | 8/2015 | Douskey et al. | |
| 9,437,328 B2 * | 9/2016 | Yang | G06F 11/1048 |
| 9,459,651 B2 | 10/2016 | Moheban et al. | |
| 9,529,044 B1 | 12/2016 | Taneja et al. | |
| 9,733,308 B2 | 8/2017 | Whetsel | |
| 10,281,524 B2 | 5/2019 | Chadalavda et al. | |
| 10,317,463 B2 | 6/2019 | Sonawane et al. | |
| 2002/0162063 A1 | 10/2002 | Whetsel | |
| 2002/0196886 A1 | 12/2002 | Adkisson | |
| 2002/0199124 A1 | 12/2002 | Adkisson | |
| 2003/0053489 A1 | 3/2003 | Zerbe et al. | |
| 2003/0229834 A1 | 12/2003 | Cooke | |
| 2004/0177300 A1 * | 9/2004 | Biewenga | G01R 31/318555 714/727 |
| 2004/0190665 A1 | 9/2004 | Uratani et al. | |
| 2004/0194109 A1 * | 9/2004 | Boros | G06F 9/30101 718/107 |
| 2005/0024074 A1 | 2/2005 | Benjamin et al. | |
| 2005/0055617 A1 | 3/2005 | Wang et al. | |
| 2005/0102643 A1 | 5/2005 | Hou et al. | |
| 2005/0209805 A1 | 9/2005 | Chang et al. | |
| 2005/0234674 A1 | 10/2005 | Bundy et al. | |
| 2005/0242836 A1 | 11/2005 | Goetting et al. | |
| 2005/0262492 A1 | 11/2005 | Goetting et al. | |
| 2006/0022724 A1 | 2/2006 | Zerbe et al. | |
| 2006/0026473 A1 | 2/2006 | Patrick Tan | |
| 2006/0095818 A1 | 5/2006 | Bratt et al. | |
| 2006/0149987 A1 | 7/2006 | Klowden et al. | |
| 2007/0106923 A1 | 5/2007 | Aitken et al. | |
| 2007/0300001 A1 * | 12/2007 | Dirscherl | G06K 19/07 710/301 |
| 2008/0008015 A1 | 1/2008 | Darbinyan et al. | |
| 2008/0034334 A1 | 2/2008 | Laouamri et al. | |
| 2008/0046770 A1 | 2/2008 | Jong et al. | |
| 2008/0092005 A1 * | 4/2008 | Huott | G01R 31/318547 714/738 |
| 2008/0276116 A1 | 11/2008 | Bjerregaard | |
| 2009/0150709 A1 | 6/2009 | Arnold et al. | |
| 2009/0184735 A1 | 7/2009 | Wicki et al. | |
| 2010/0223519 A1 | 9/2010 | Swoboda | |
| 2010/0235698 A1 | 9/2010 | Diewald et al. | |
| 2011/0099442 A1 * | 4/2011 | Hales | G01R 31/318533 714/729 |
| 2011/0221469 A1 | 9/2011 | Schlagenhaft | |
| 2012/0117436 A1 | 5/2012 | Portolan et al. | |
| 2012/0146535 A1 * | 6/2012 | Lee | H05B 33/0818 315/250 |
| 2012/0159276 A1 | 6/2012 | Zandian et al. | |
| 2013/0159800 A1 | 6/2013 | Ravi et al. | |
| 2013/0194016 A1 | 8/2013 | Wimer | |
| 2013/0205160 A1 * | 8/2013 | Turner | G06F 5/12 713/400 |
| 2014/0089750 A1 | 3/2014 | Douskey et al. | |
| 2014/0157067 A1 * | 6/2014 | Yang | G06F 11/1048 714/720 |
| 2014/0247080 A1 | 9/2014 | Moheban et al. | |
| 2014/0292385 A1 * | 10/2014 | Bahl | H03K 3/012 327/144 |
| 2014/0298125 A1 | 10/2014 | Devadze et al. | |
| 2015/0046763 A1 | 2/2015 | Makar et al. | |
| 2015/0178102 A1 | 6/2015 | Regner et al. | |
| 2015/0220470 A1 | 8/2015 | Chen et al. | |
| 2015/0229469 A1 * | 8/2015 | Hainz | H04L 7/0332 375/225 |
| 2015/0341161 A1 * | 11/2015 | Khan | H04L 7/033 375/373 |
| 2016/0070619 A1 | 3/2016 | Moran et al. | |
| 2016/0105273 A1 * | 4/2016 | Choi | H03M 9/00 375/376 |
| 2017/0115338 A1 | 4/2017 | Chadalavda et al. | |
| 2017/0115345 A1 * | 4/2017 | Sonawane | G01R 31/31701 |
| 2017/0115346 A1 | 4/2017 | Sonawane et al. | |
| 2017/0115351 A1 | 4/2017 | Datla Jagannadha et al. | |

(56) References Cited

U.S. PATENT DOCUMENTS

| | | |
|---|---|---|
| 2017/0115352 A1* | 4/2017 | Jayaraman ....... G01R 31/31701 |
| 2017/0133070 A1 | 5/2017 | Ware et al. |
| 2017/0195754 A1* | 7/2017 | Grambichler ........ H04L 7/0091 |
| 2017/0205465 A1 | 7/2017 | Sarangi et al. |
| 2017/0269145 A1 | 9/2017 | Whetsel |
| 2018/0122444 A1 | 5/2018 | Ware et al. |

* cited by examiner

900

910

Receiving external test information at an external communication rate.

920

Converting the test information into control instructions for a central test controller.

930

Communicating control instructions to the test controller in accordance with an internal communication rate.

Fig 9

GRANULAR DYNAMIC TEST SYSTEMS AND METHODS

RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS";

which are all hereby incorporated by reference in their entirety for all intents and purposes.

FIELD OF THE INVENTION

The present invention relates to the field of circuit testing. In one embodiment, granular dynamic test systems and methods are utilized to facilitate fast and flexible test partition communication and operation.

BACKGROUND

Numerous electronic technologies such as digital computers, video equipment, and telephone systems have facilitated increased productivity and reduced costs in processing information in most areas of business, science, and entertainment. Testing the components is typically an important activity in ensuring proper performance and accurate results. The testing of semiconductor devices often involves performing test operations in accordance with controls referred to as test patterns. Execution of the test patterns typically involves loading and unloading scan chains with test vectors. However, there are a number of factors that can impact testing and traditional testing approaches are often costly and inefficient.

A system on chip (SoC) design is typically composed of several blocks of circuitry, some of which may have similar designs that are used or replicated in different parts of the chips. The several blocks of circuitry are often configured or organized in test blocks or test partitions for purposes of testing the circuitry. Traditional approaches to generating a full set of conventional test patterns targeted at multiple test partitions and executing the test patterns at substantially similar or parallel times is computationally intensive and time consuming. These conventional attempts are often unable to meet limited cost budgets and constrained project schedules.

Transistor feature sizes continue to shrink and smaller transistors allow more circuits to be included in a given die area. Although transistor technological advances offer a number of advantages, they also create design-for-testability (DFT) challenges. In traditional scan based tests, a significant portion of test time is spent communicating information to and from internal components (e.g., loading test commands, loading test patterns or test vectors, unloading test results, etc.). Larger and more complex circuits usually require longer test times. Conventional attempts at reducing test times by increasing shift clock frequencies or testing the entire design at the same time are often problematic and ineffective. Conventional test architectures are typically limited to supporting only one type of test vector across test partitions and don't typically enable parallel or true concurrent testing. For example, conventional solutions do not usually enable automatic test equipment and circuits under test to concurrently run a memory test in one test partition and scan test in another test partition. In a complex system-on-chip (SoC), coordinating different types of test commands and test vectors is typically very limited and very complicated, giving rise to a number of problems and issues.

SUMMARY

In one embodiments, a system comprises: a plurality of scan test chains configured to perform test operations at a first clock speed; a central test controller for controlling testing by the scan test chains; and an interface configured to generate instructions to direct central test controller. The interface communicates with the centralized test controller at the first clock speed and an external scan input at a second clock speed. The second clock speed can be faster than the first clock speed. In one embodiment, the first clock speed is faster than a JTAG CLK speed. The instructions communicated to the central controller can be directions associated with sequential scan compression/decompression operations. In one exemplary implementation, the interface further comprise a mode state machine used to generate the mode control instructions and a test register state machine that generate test state control instructions, wherein the test mode control instructions and the test state control instructions direct operations of the centralized test controller. The interface operations can be coordinated with a dynamic standard test access (DSTA) operation associated with test data input and test data output. The dynamic standard test access can be coordinated with the second clock speed for communication of external data and the first clock speed for communication of internal data.

In one embodiment, a test method comprises: receiving external test information at an external communication rate; converting the test information into control instructions for a central test controller; and communicating control instructions to the test controller in accordance with an internal communication rate. In one embodiment, the external communication rate is faster than the internal communication rate. The converting comprises generating state instructions for the centralized controller. The converting can comprise generating mode instructions for the centralized controller. The external test information can be deserialized, in which a single stream of the test information is received at the external rate and a plurality of streams are forwarded at the internal rate. The control instructions are compatible with a various types of testing including Automatic Test Pattern Generation (ATPG) testing, Memory Built In Self Test (MBIST), Input/Output Built In Self Test (IOBIST) and so on. The converting can be compatible with concurrent testing of multiple independent test partitions.

In one embodiment, a system comprises: a plurality of functional components arranged in physical partitions; a plurality of scan test chains configured to perform test operations on the plurality of functional components at a first clock speed; a centralized test controller for controlling testing by the scan test chains; and an interface configured to communicate with the centralized test controller via external scan inputs at a second clock speed, wherein the second clock speed is faster than the first clock speed. Each partition can have a sequential compressor and de-compressor and test data input has a corresponding deserializer and test data output has a corresponding serializer. In one exemplary implementation, the interface facilitates independent management of a partition testing (e.g., concurrent testing across the multiple partitions, different types of testing across the multiple partitions, etc.). The interface can be a standardized test interface.

In one embodiment, an interface device comprises: a mode state machine configured to derive test mode control signals forwarded to a test partition central controller; a test register state machine configured to derive test state control signals forwarded to the test partition central controller, and a deserializer that deserializes a stream of test related information from an external source into a mode state machine input and a test register state machine input. The first side of the deserializer receives test information communicated via an external communication port and a second side of the deserializer forwards test information to the mode state machine and the test register state machine. The first side of the of the deserializer operates at a first clock rate and the second side of the of the deserializer operates at a second clock rate. In one exemplary implementation, the first clock rated is faster than the second clock rate. The central controller can be configured to coordinate test control information for test scan compression components and test scan decomprsssion components. The test register state machine can be driven by a data load serialize/deserialize component. In one exemplary implementation, a data load serialize/deserialize module is included in a dynamic standard test access (DTSA) component. The mode state machine and test register state machine can be in lock state.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 9 is a flow chart of test method in accordance with one embodiment.

DETAILED DESCRIPTION OF THE INVENTION

Figure 1:
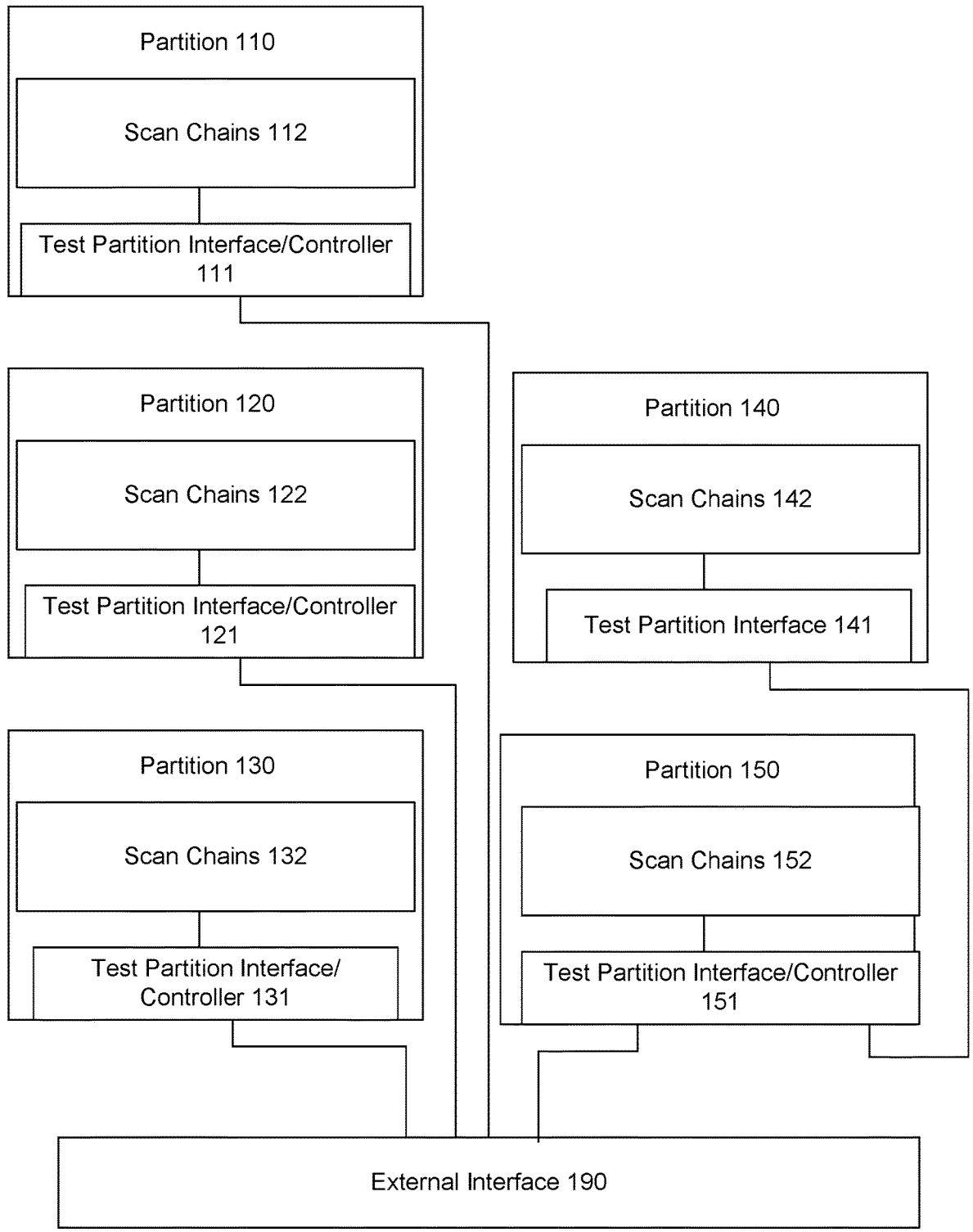
FIG. 1 is a block diagram of test system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Efficient and effective granular dynamic test systems and methods are presented. In one embodiment, the granular dynamic test systems and methods enable flexible adjustment and adaptability to a variety of different conditions that arise during testing. The granular dynamic test systems and methods can enable flexible and dynamic utilization of ultra fast interfaces that are compatible with a variety of test operations (e.g., execution of different types of tests, different test modes, etc.). The different types of tests can include conventional Automatic Test Pattern Generation (ATPG), Memory Built In Self Test (MBIST), Input/Output Built In Self Test (IOBIST), and so on. The tests can also include different test modes associated with different test operations (e.g., functional operations, shift operations, capture operations, etc.). In one exemplary implementation, the different types of tests and test modes can be executed in substantially in parallel or concurrently across various circuits or sections of a die. The flexible adjustment and adaptability facilitate conservation of resources and improved testing performance over conventional approaches.

An Ultra-Fast Interface (UFI) test access mechanism is an expedient and flexible mechanism for testing operations, unlike traditional ways of communicating to a centralized controller. In one embodiment, a UFI test access mechanism can provide high bandwidth access to test logic with reduced cycle overhead while allowing concurrent testing of multiple test partitions in a chip. A UFI can be used to coordinate communication between external scan inputs at relatively higher speed and communications or operations within a test partition at a relatively slower speed. In one embodiment, both the external communication operations and internal test partition operations are faster than JTAG TCK.

Without an ultra-fast-interface (UFI) interface a number of issues can arise when attempting to interface between with a centralized test controller and a standard JATG controller. For example, the issues can include: trying to load separate instruction in IR (which could be greater than 32 bits); a JTAG Test Access Mechanism (TAM) needs to go through the instruction register (IR) path and then the data register (DR) path of the state machine (which could cause cycle overhead as shown in FIG. 3B); JTAG TCK clocks are typically slower than core chain clocks causing slow access to test controller; JTAG is usually limited to a single test partition access at a time (does not allow concurrent testing of different test partitions); and so on.

Partition Testing Approach

In one embodiment, circuits under test in a System On a Chip (SOC) design are configured or organized into a hierarchy of groups or sets of circuitry. A functional circuit and associated test circuitry are organized into test units or cells. The test units are coupled together into scan chains and the scan chains are configured or organized into test partitions or test blocks. The test partitions and components therein can be organized based on a variety of factors (e.g., components involved in a type of function, particular design of the circuitry, intellectual property, size, portion of die area, number of functional components, electrical characteristics, safety limitations, power consumption, etc.).

While the organization of test operations based upon test partitions does offer greater testing granularity, the increased number of test partitions and the many possible different test characteristics and features of the test partitions gives rise to very complex and complicated test environments. The presented granular dynamic testing systems and methods are configured to facilitate testing of the different complex characteristics and factors associated with the multiple test partitions in an efficient and effective manner.

FIG. 1 is a block diagram of test system 100 in accordance with one embodiment. Test system 100 includes test partition 110, test partition 120, test partition 130, test partition 140, test partition 150 and external interface 190. Test partitions 110, 120, 130,140, and 150 include scan chains 112, 122, 132, 142, and 152 respectively. Test partitions 110, 120, 130, and 140 include test partition interfaces/controllers 111, 121, 131, and 141. In one embodiment, test partitions 140 and 150 are very similar and are considered to be similar IP or functionally equivalent. As such, the test partition interface/controller 141 can be considered to provide control operations for test partition 150 via test partition interface 151. In one embodiment, test partition interface/controller 141 is considered a centralized controller for both test partition 140 and test partition 150. Test partition interface 151 can be less complex than test partition interface/controller 141 (e.g., interface 151 has less controls and is considered an interface rather than interface/controller). It is appreciated that test system 100 can have a variety of configurations. In one embodiment, there are some test interface and control operations that can be performed by a centralized controller even if the partitions are not similar (e.g., do not have same IP, are not functionally similar, etc.).

In one embodiment, a granular dynamic test interface is standardized. In one exemplary implementation, granular dynamic test interfaces are standardized to have similar and consistent characteristics and features. A granular dynamic test interface can enable flexible adjustment to support interactions between various external interface configurations and components within a test partition. The granular dynamic flexible nature of the test interface can allow efficient utilization and reuse of test partition designs and test patterns. A granular dynamic test interface can facilitate independent and efficient design, fabrication, and testing of test partitions. The flexible and independent nature can allow management and implementation of concurrent testing operations across multiple test partitions. The testing can be directed to different types modes etc. In one embodiment, aspects of testing across multiple test partitions can be coordinated while maintaining independent characteristics and features within the test respective test partitions. In one exemplary implementation, the trigger edges of respective testing clock signals are stagger across multiple test partitions and coordinated to reduce peak power consumption, while still allowing independent different types of test operations to be performed at different speeds within the respective multiple test partitions.

Figure 2:
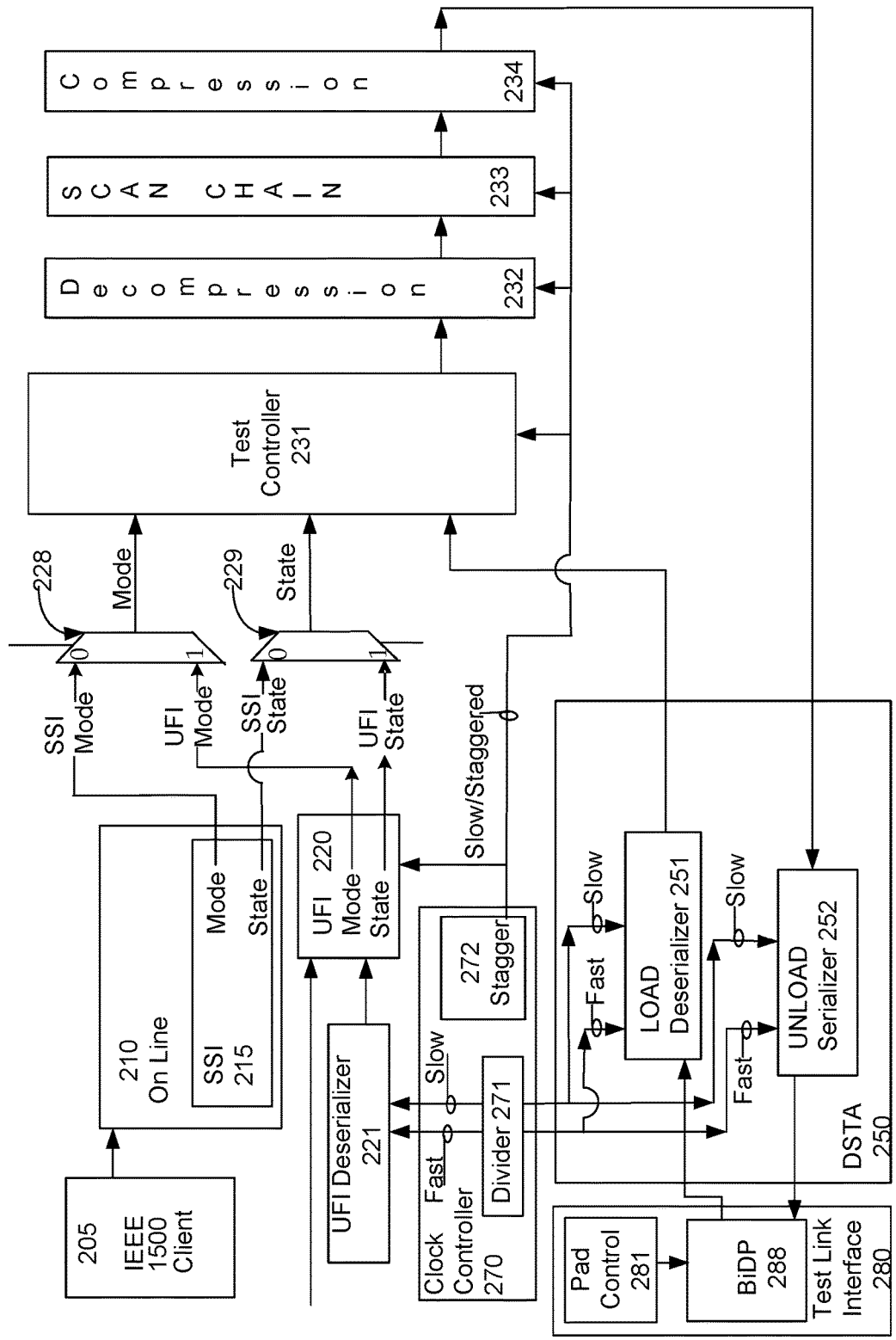
FIG. 2 is a block diagram of an exemplary system in accordance with one embodiment.

FIG. 2 is a block diagram of an exemplary system 200 in accordance with one embodiment. System 200 can operate as a test partition interface/controller. In one exemplary implementation, system 200 is similar to a test interface/controller 111 or 121. System 200 includes IEEE 1500 client interface 205, On Line module 210, Ultra Fast Interface (UFI) controller 220, UFI de-serializer 221, mode MUX 228, State MUX 229, Test Controller 231, Scan Decompression Component 232, Scan Chain Component 233, Scan Compression Component 234, Dynamic Scan Test Access (DSTA) Component 250, Clock Controller 270 and Test Link Interface 280 and Bi-Directional Pads 288. Mode MUX 228 and State MUX 229 are coupled to Test Controller 231, Ultra Fast Interface (UFI) controller 220 and On Line module 210 which is coupled to IEEE 1500 client interface 205. UFI 220 is coupled to UFI de-serializer 221. Clock controller 270 is coupled to Ultra Fast Interface (UFI) controller 220, UFI de-serializer 221, Test Controller 231, Scan Decompression Component 232, Scan Chain Component 233, Scan Compression Component 234, and DSTA 250. DSTA 250 is coupled to Bi-Directional Pads 288 which are in Test Link Interface 280. On Line module 210 can include SSI 215. Clock Controller 270 can include divider 271 and stagger 272. DSTA 250 can include load component 251 and unload component 252.

In one embodiment, UFI de-serializer 221 receives an ultra fast serial signal and de-serializes the signal into separate signals that are forwarded to the UFI module 220. UFI module 220 generates UFI mode information and UFI state information which is fed into mode MUX 228 and State MUX 229 respectively. On Line module 210 receives signals from IEEE 1500 client interface 205 and generates SSI mode information and SSI state information which is fed into mode MUX 228 and State MUX 229 respectively. Mode MUX 228 selects either the UFI mode information or SSI mode information and forwards the selected information to Test Controller 231. State MUX 229 selects either the UFI state information or SSI state information and forwards the selected information to Test Controller 231.

Test controller 231 organizes the test signals and forwards them to Scan Decompression Component 232. Scan Decompression Component 232 decompresses the signals and forwards them to Scan Chain Component 233. Scan Chain Component 233 performs the scan test operations (e.g., scan shift, scan capture, etc.) and forwards the results to Scan Compression Component 234. Scan Compression Component 234 compresses the test results and forwards the compressed test results to DSTA 250. DSTA 250 receives scan test input data from external connections of bi-directional pads 288 and forwards scan test output data to external connections of bi-directional pads 288. Test Link Interface 280 includes pad direction controller 281 that controls the communication direction of Bi-Directional Pads 288. Clock controller 270 generates clocks signals.

In one embodiment, the clock signals are coordinated in accordance with the rates of input and output signals of the various components. In one exemplary implementation, the Clock controller 270 receives a single free flowing clock input and generates a fast internal clock, a slow internal clock and a slow staggered internal clock. The fast internal clock and slow internal clock are forwarded to the UFI deserializer 221, LOAD deserializer 251, and UNLOAD serializer 252 for use in respective deserializing/serializing operations. The slow staggered internal clock is forwarded to Test Controller 231, Scan Decompression Component 232, Scan Chain Component 233 and Scan Compression Component 234 for clocking the test operations of the respective components.

In one embodiment, a centralized controller directs testing operations for one or more scan chains. A centralized test controller can handle the communication to the CODEC modules to generate stimulus data, and compare response data. The centralized controller module in turn is controlled using a set of instructions sequenced using an interface (e.g., UFI interface, JTAG TAP interface, etc.). This scheme of centralized controlling can be utilized with a variety of test techniques such as logic scan test, memory test etc.

The granular dynamic test systems and methods can be implemented in a combinational scan compression architecture or a sequential scan compression architecture. The granular dynamic test systems and methods for sequential scan compression architecture can be used to reduce scan pin requirements, improve pattern quality, and test partition design reuse. In one embodiment, the sequential scan compression is a hierarchical scan architecture, where a centralized test controller with an Instruction Decode Unit (IDU) is implemented per top level chiplet test partition and controlling CODECs. Sequential CODECs include a sequential de-compressor and sequential compressor, where the de-compressor operates with a LFSR and the compressor operates with a MISR. In one exemplary implementation, a CODEC is included in a test partition of the Chiplet. The centralized controller and IDU can be integrated at a top level Chiplet test partition in order to expand ATPG instructions or directions to generate an internal ATPG pattern. In one exemplary implementation, the ATPG patterns are utilized in sequential scan compression mode production testing.

Ultra Fast Interface

Figure 3A:
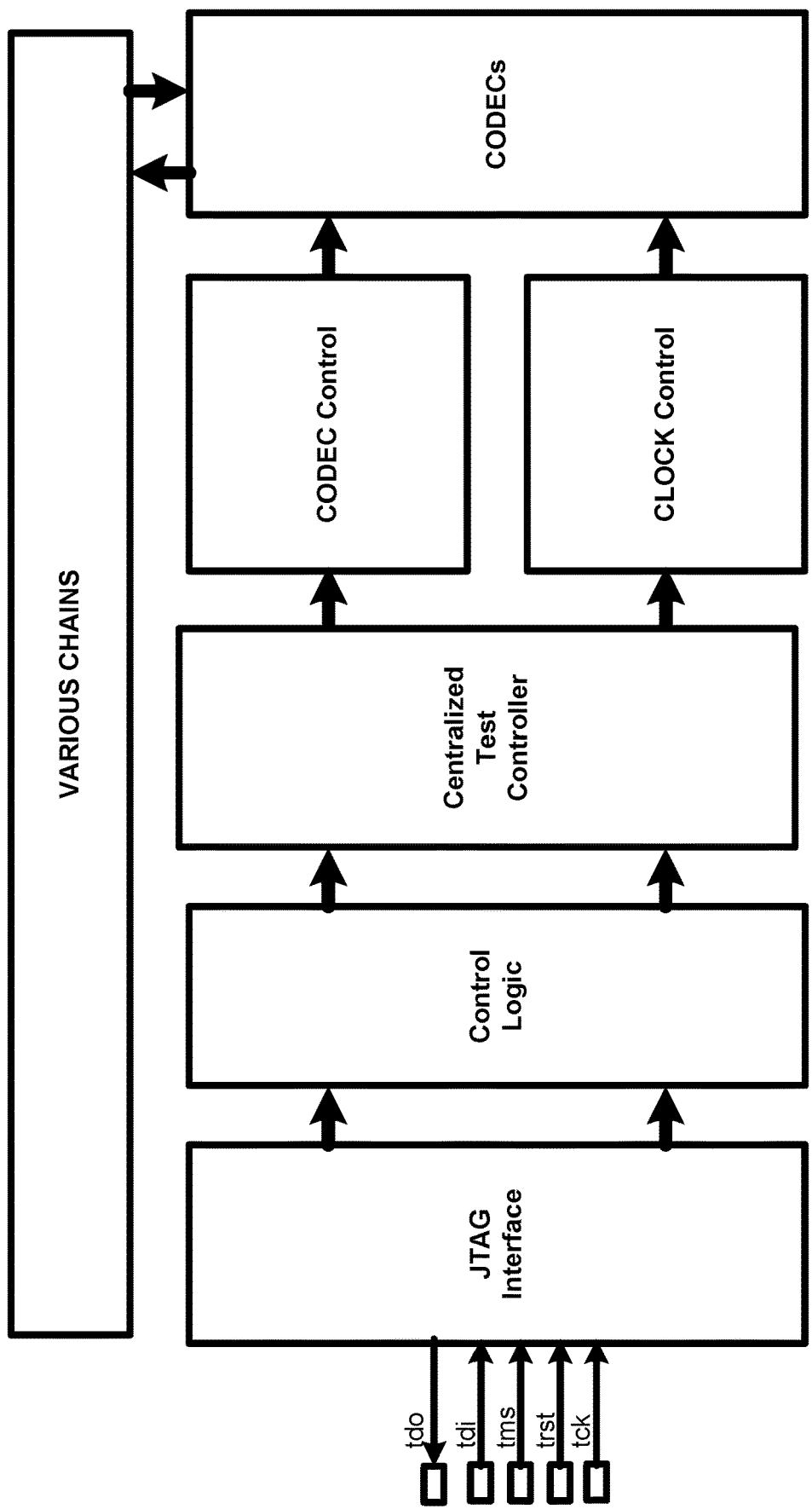
FIG. 3A is a block diagram of a centralized test controller interface with JTAG controls in accordance with one embodiment.
Figure 3B:
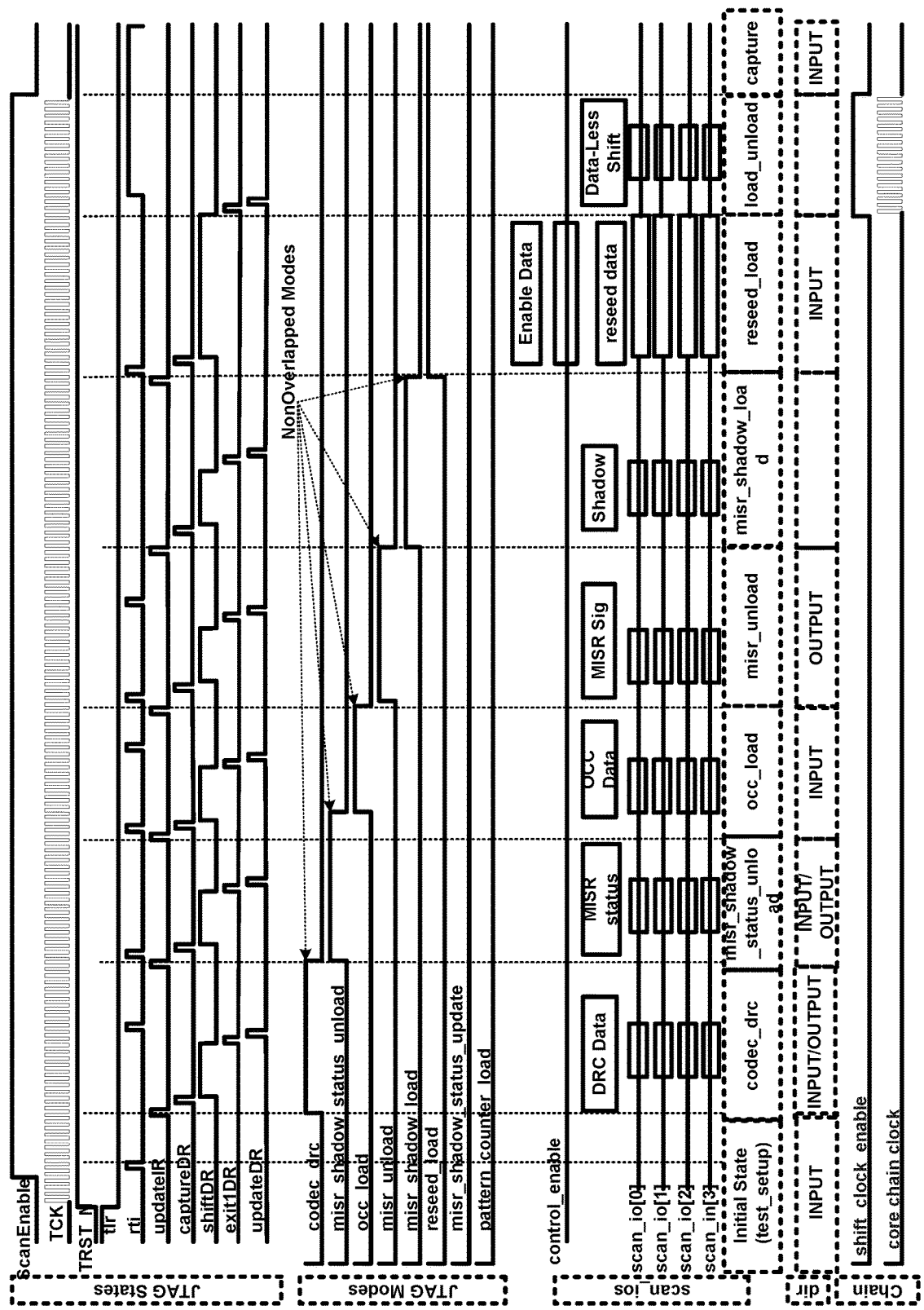
FIG. 3B is a timing diagram of a centralized test controller interface with JTAG controls in accordance with one embodiment.

FIG. 3A is a block diagram of a centralized test controller interface with JTAG controls in accordance with one embodiment. FIG. 3B is a timing diagram of a centralized test controller of FIG. 3A in accordance with one embodiment. Without an ultra-fast-interface (UFI) interface a number of issues can arise when attempting to interface between with a centralized test controller and a standard JTAG controller. For example, a JTAG Test Access Mechanism (TAM) needs to go through the instruction register (IR) path and then the data register (DR) path of the state machine (which could cause cycle overhead as shown in FIG. 3B).

Figure 4:
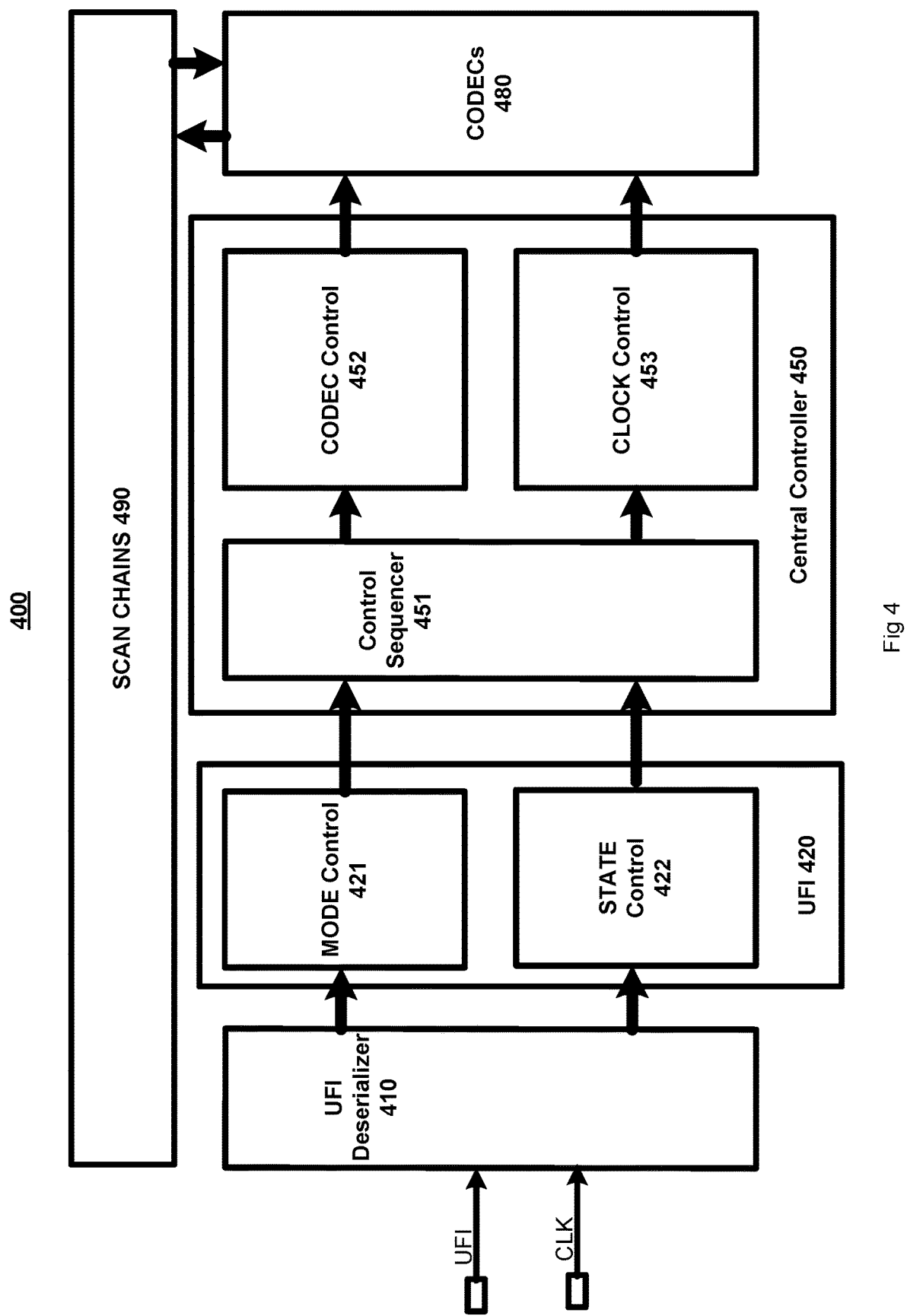
FIG. 4 is a block diagram of a centralized test controller using an ultra fast interface in accordance with one embodiment.

FIG. 4 is a block diagram of a system 400 with a centralized test controller using an ultra fast interface in accordance with one embodiment. System 400 includes UFI deserializer 410, UFI 420, central controller 450, CODECs 480, and scan chains 490. The central controller 450 includes control sequencer 451, CODEC control 452, and clock control 453. UFI 420 includes mode control 421 and state control 422. UFI deserializer 410 receives information from an external UFI input in accordance with an external clock. In one embodiment, the external clock is a relatively fast clock. The UFI deserializer 410 deserializes the external input into multiple mode and state select signals forwarded UFI 420. Mode control state machine 421 and state control state machine 422 generate mode controls and state controls respectively, which are forwarded to central controller 450. Control sequencer 452 sequences the instructions codec control 452 and clock control 453. CODEC control 452 generates CODEC instructions and clock control 453 coordinates with clock signals. The CODEC instructions and clock control signals are used to control the CODECs 480. CODECs 480 generate ATPG patterns for scan chains 490.

Figure 5A:
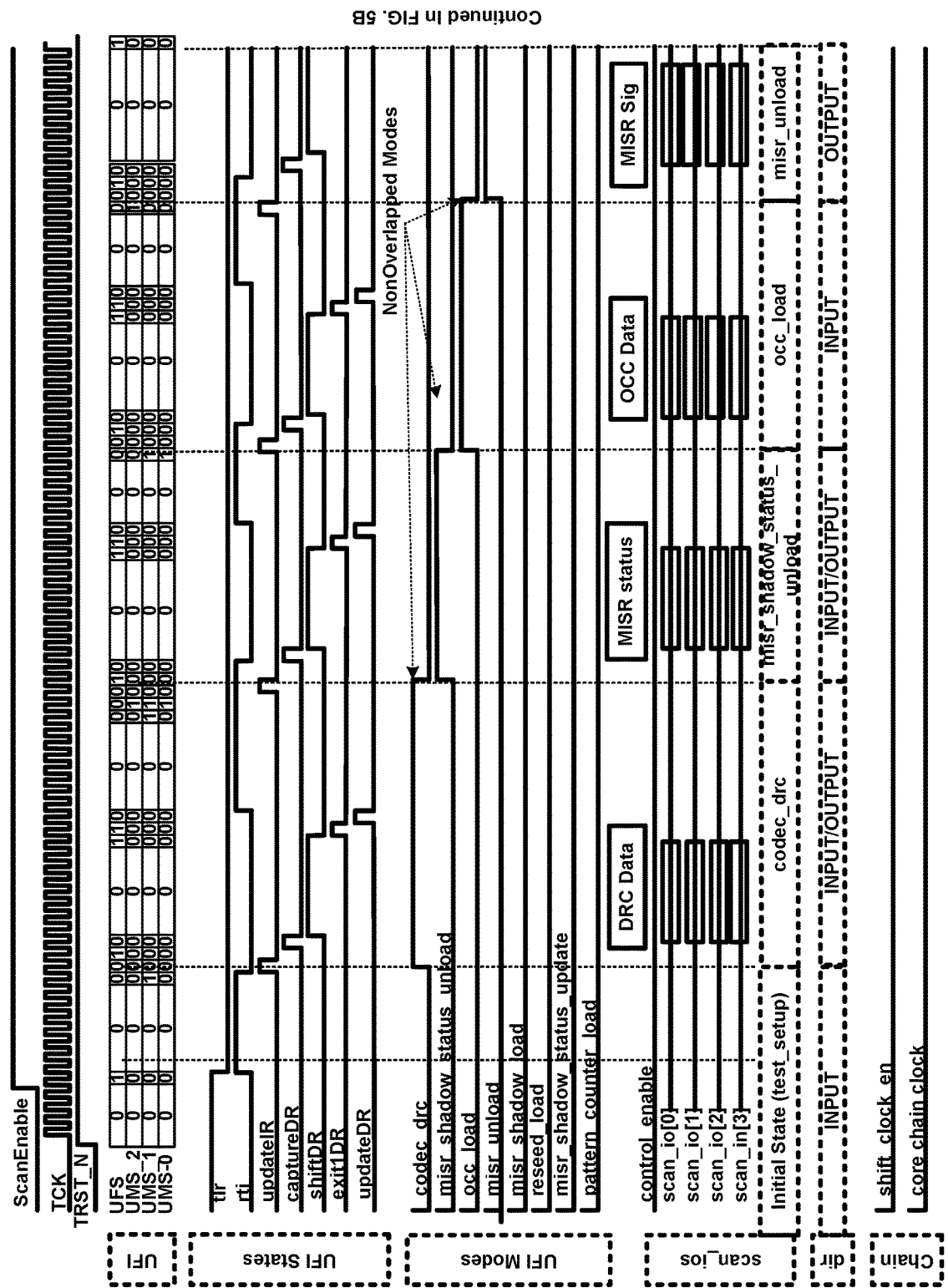
FIGS. 5A and 5B is a timing diagram of a centralized test controller using an ultra fast interface in accordance with one embodiment.
Figure 5B:
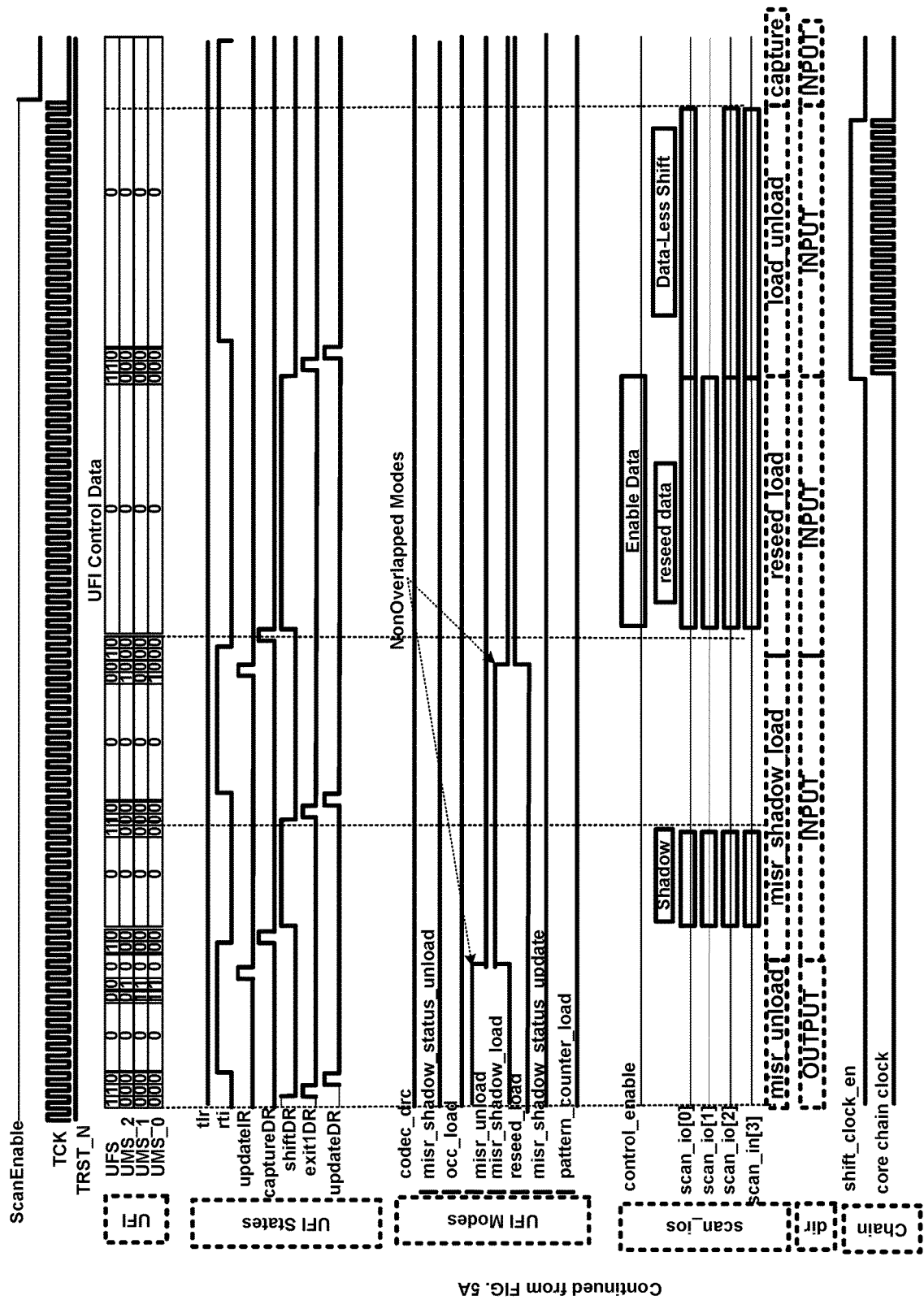

FIGS. 5A and 5B are an exemplary timing diagram for system 400 with a centralized test controller using an ultra fast interface in accordance with one embodiment.

Following table 1 lists the mode control and states required for centralized test controller to sequence operation of sequential scan compression to generate ATPG test patterns in accordance with one embodiment.

| CENTAL CONTROLLER STATES AND MODES | DESCRIPTION |
| --- | --- |
| TLR | Test Logic Rest state |
| RTI | Return to IDLE state |
| CDR | Capture data register (DR) state |
| SDR | Shift Data Register (DR) state |
| EDR | Exit 1 Data Register (DR) state) |
| UDR | Update Data Register (DR) state |
| UIR | Update Instruction Register (IR) state |
| RESET | RESET Mode |
| IDLE | IDLE Mode |
| CODEC_DRC | CODEC DRC Mode |
| OCC_LOAD | OCC Lode mode |
| MISR_UNLOAD | MISR Unload Mode |
| MISR_SHADOW_STATUS_UPLOAD | MISR Shadow Status Mode |
| MISR_SHADOW_STATUS_UPDATE | MISR Shadow Status Update Mode |
| MISR_SHADOW_LOAD | MISR Shadow Preload Mode |
| RESEED_LOAD | Reseed Load Mode |
| PATTERN_COUNTER_LOAD | Pattern Counter Load Mode |
| CAPTURE | Capture Mode |

Figure 6:
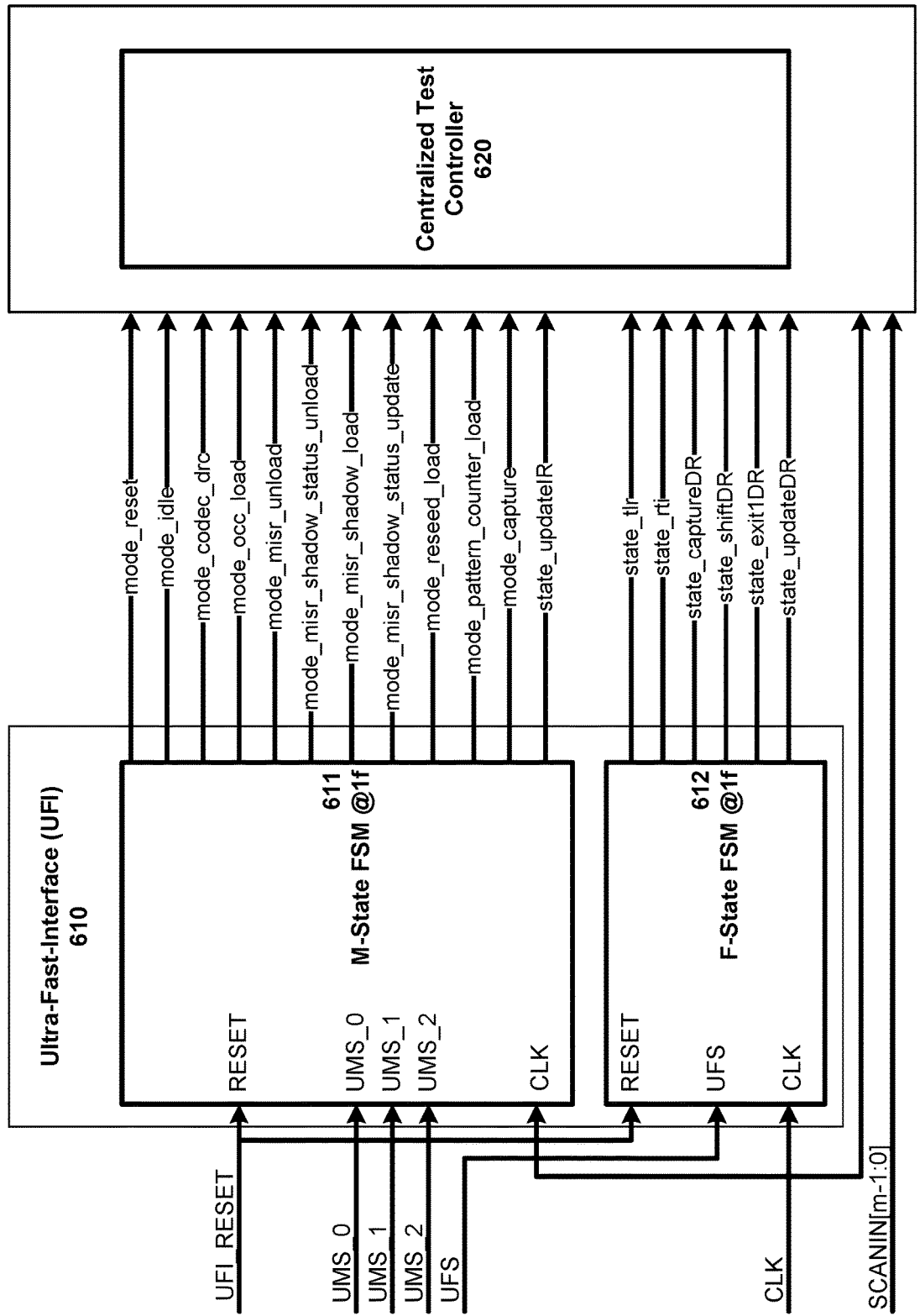
FIG. 6, is a block diagram of an exemplary Ultra-Fast-Interface (UFI) control module in accordance with one embodiment.

FIG. 6, is a block diagram of an exemplary Ultra-Fast-Interface (UFI) control module 610 in accordance with one embodiment. UFI module 610 can be used to interface from external scan inputs to communicate with the test controller 620. Ultra-Fast-Interface (UFI) control module 610 includes M-State finite state machine (FSM) 611 and test register or F-State finite state machine (FSM) 612. Mode select signals UMS_2, UMS_1, UMS_0 are used to derive mode controls, and Fstate Select is used to derive state controls driving the centralized test controller.

UFI input/output (IO) requirements can be optimized by 1) Serializing UFS signals and UMS signals on a single UFI pin; 2) Serializing broadcasted SCANIN data; and 3) coordinating with reduced pin count and standard test interface approaches. With reference back to FIG. 2, in one embodiment, UFI deserializer 221 is used to deserialize information for UFI module 220 and the SERDES Module or Dynamic Standard Test Access is used for test link interface 280. The deserializers and serializers working on a fast clock for external fast data and a slow clock for internal slow data. The fast and slow clocks are derived from a clock divider (e.g., divider 271, etc.) which is running on external fast clocks. One side of the deserializers 221 and 251, one side of serializer 252, centralized test controller 231, CODEC components 232 and 234, and UFI module 220 can run at a slow clock rate. In one embodiment, by using Dynamic Standard Test Access 250, the number of control pins required for UFI 220 is only one pin achieving the goal of single pin UFI control for the UFI module 220. In one embodiment, the test data is input and output via a DSTA component and a pin control component.

A slow clock and a fast clock can be derived from a clock divider running on external fast clocks. The test controller, CODECs, SERDES modules can run at the slow clock speed. A SERDES Fast interface and the external scan data pipeline stages can run at the fast clock speed. There can be various combinations of SDP and SERDES to facilitate broadcasting and forking of SDP paths on UFI pin. In an actual physical implementation of larger chips there can be hundreds of partitions. In one embodiment, each partition has CODEC (Sequential DeCompressor and Compressor). Scan data pipeline stages can be introduced at several locations on the paths from scan input external chip pins to each partition in order to meet timing coordination associated with the higher scan test shift speeds.

As indicated previously, a UFI facilitates granular dynamic efficient testing. The testing can include standardized interface characteristics, concurrent testing of multiple partitions, compatible with different types of tests, at different external and internal communication and operation rates, and so on. In one embodiment, finite state machines are used to derive the state control signals and mode control signals for a test partition controller. The state machines enable coordination with the different clock rates and different types of tests. In one embodiment, the state machines can provide directions that are compatible with various types of tests, such as Automatic Test Pattern Generation (ATPG) testing, Memory Built In Self Test (MBIST), Input/Output Built In Self Test (IOBIST), and so on. The state machines can also coordinate timing of mode control and state control signals to a test partition controller with external inputs and outputs at different rates.

Figure 7:
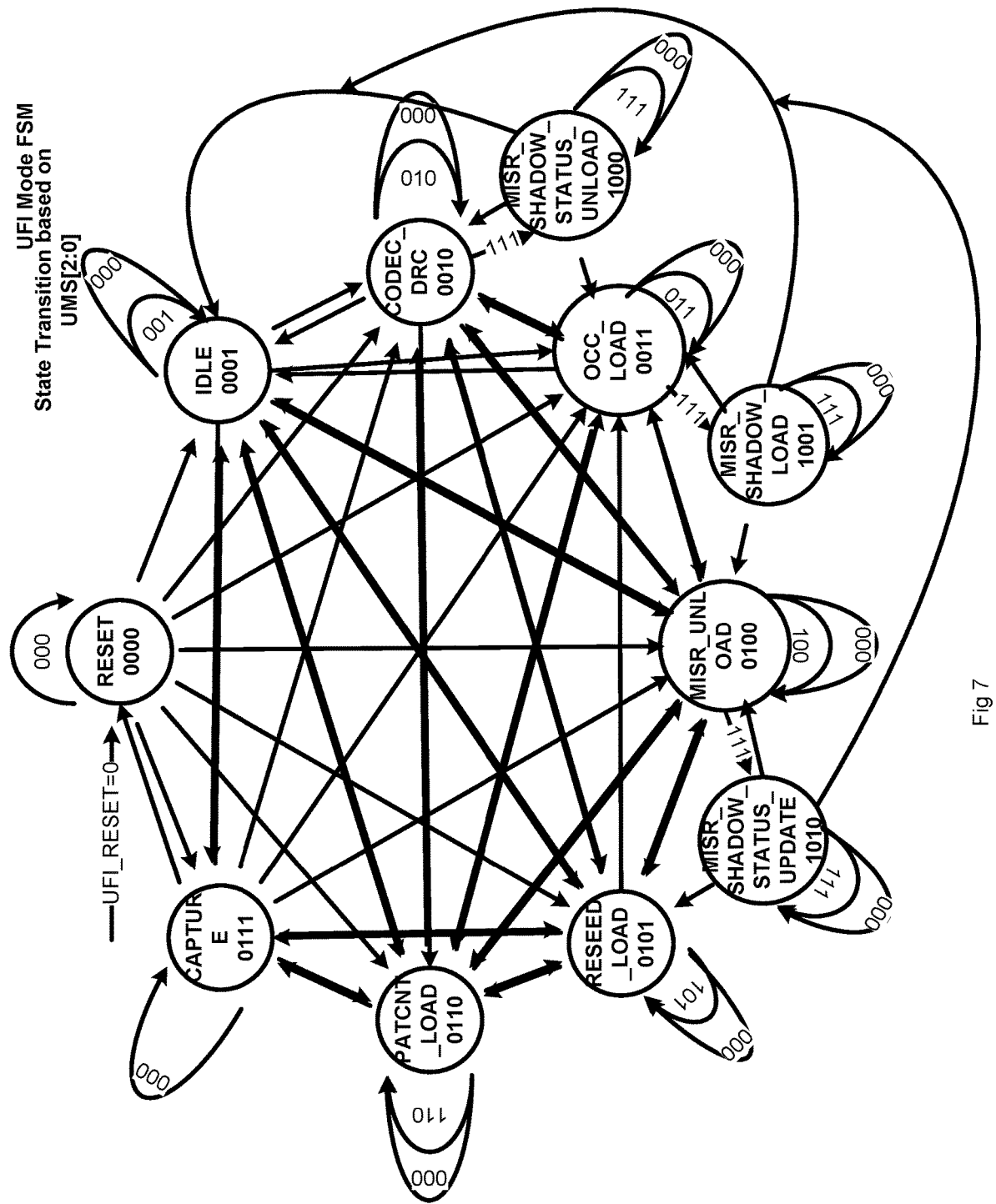
FIG. 7 is a block diagram of the states of an exemplary UFI mode state machine in accordance with one embodiment.

FIG. 7 is a block diagram of the states of an exemplary UFI mode state machine in accordance with one embodiment. In one exemplary implementation, the mode states include a reset mode, an idle mode, a codec design rule check mode (CDR), MISR shadow status unload mode, on chip clock load mode, MISR shadow status load mode, MISR unload mode, MISR shadow status undate mode, reseed load mode, pattern count load mode, and capture mode. A mode state machine is used to derive mode controls signals required for test controller. These mode controls signals are mode_codec_drc, mode_occ_load, mode_misr_unload, mode_misr_shadow_status_unload, mode_misr_shadow_load, mode_misr_shadow_status_update, mode_reseed_load, mode_pattern_counter_load, mode_capture etc. The Mode state machine uses mode select signals UMS_2, UMS_1, UMS_0 (which can be received on individual pins or can be driven by a deserializer module).

Accessing these modes and states required for centralized test controller using traditional JTAG access can take hundreds of cycles every time the mode or state is changed. However, a UFI takes fewer cycles when UMS_2, UMS_1, and UMS_0 are used as control pins to the state machine. In one embodiment, a mode or state can be can be done in one cycle. The test partition side of the UFI module can operate based on an internal slow clock which is still relatively faster than JTAG clock. With pipeline and Dynamic Standard Test Access module, a single UFI pin can be used to control the UFI module, and still able reduce the cycle overhead significantly.

Figure 8:
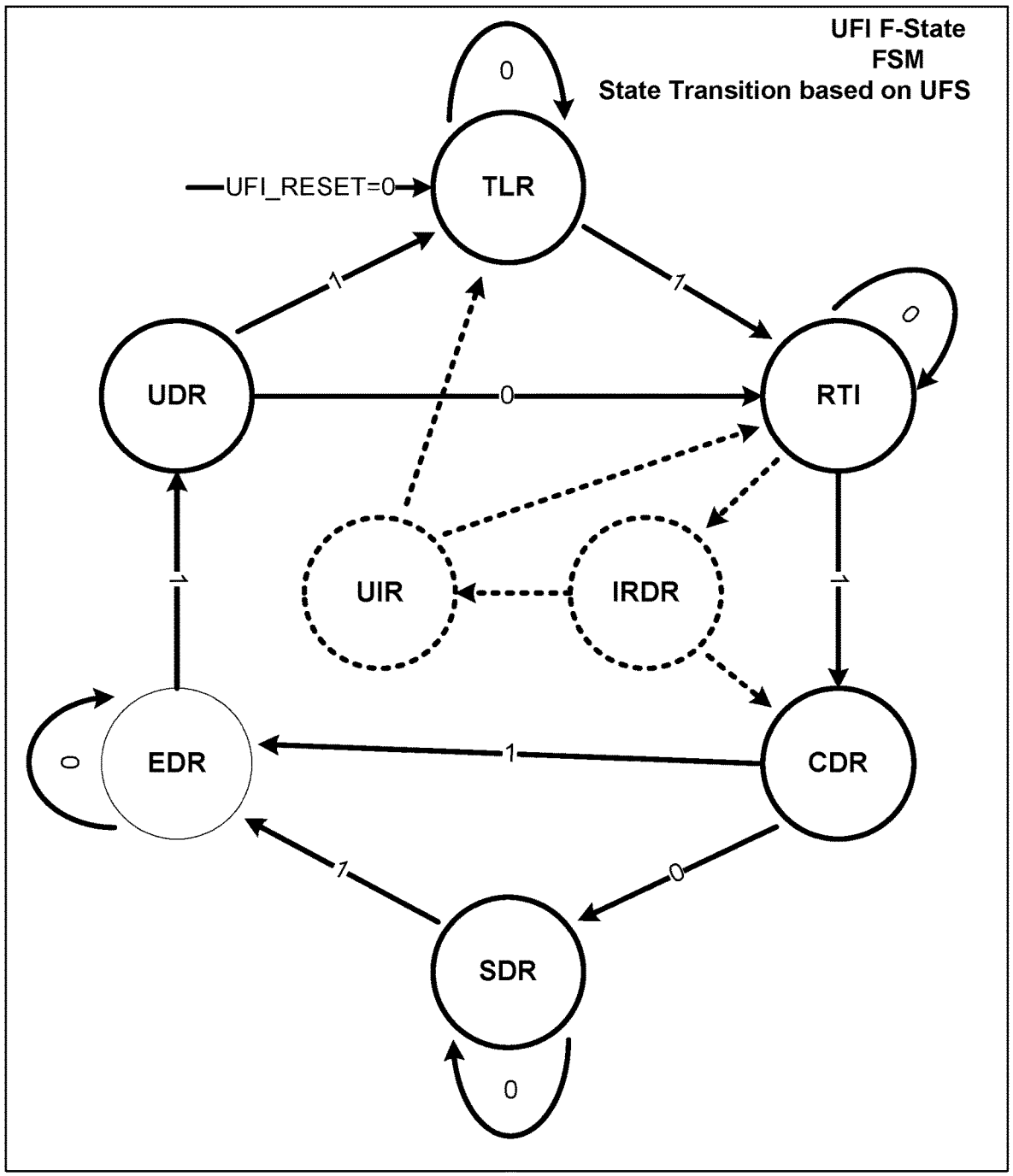
FIG. 8 is a block diagram of the states of an exemplary UFI fstate state machine in accordance with one embodiment.

FIG. 8 is a block diagram of the states of an exemplary UFI test register or fstate state machine in accordance with one embodiment. The Fstate State machine is used to derive fstate controls signals required for test controller. The test register states or fstates include a test logic reset state (TLR), a run test idle state (RTI), an instruction register/data register switch state (IRDR), an update instruction register state (UIR), a capture data register state (CDR), scan data register state (SDR), an exit data register state (EDR), and an update data register state (UDR). These fstate controls signals are state_tlr, state_rti, state_captureDR, state_shiftDR, state_exit1DR, state_updateDR, and state_updateIR. It uses Fstate select (UFS) driven by load SERDES module. It uses Ultra Fstate select (UFS) driven by Dynamic Standard Test Access Load module. In order to meet the centralized test controller mode and state control protocol requirement, both Mode and Fstate state machines can be in lock state.

FIG. 9 is a flow chart of test method in accordance with one embodiment.

In block 910, external test information is received at an external communication rate. In one embodiment, the external test information is deserialized, in which a single stream of the test information is received at the external rate and a plurality of streams are forwarded at the internal rate.

In block 920, the test information is converted into control instructions for a central test controller. The converting can comprise generating state instructions and mode instructions for a test partition centralized controller. The control instructions can be compatible with various types of testing, such as Automatic Test Pattern Generation (ATPG) testing, Memory Built In Self Test (MBIST), Input/Output Built In Self Test (IOBIST), and so on. In one exemplary implementation, the converting is compatible with concurrent testing of multiple independent test partitions.

In block 930, control instructions are communicated to the test controller in accordance with an internal communication rate. The external communication rate is faster than the internal communication rate.

Combination UFI Module

It is appreciated that a UFI can be configured as a combination UFI that has multiple different types of interfaces for use in a variety of different test environments. In one embodiment, a combination UFI can be configured to enable a UFI interface and a JTAG interface. In one exemplary implementation, a combination UFI can be configured in a first configuration for use in a production test environment and in a second configuration for use in a online test environment.

Figure 10:
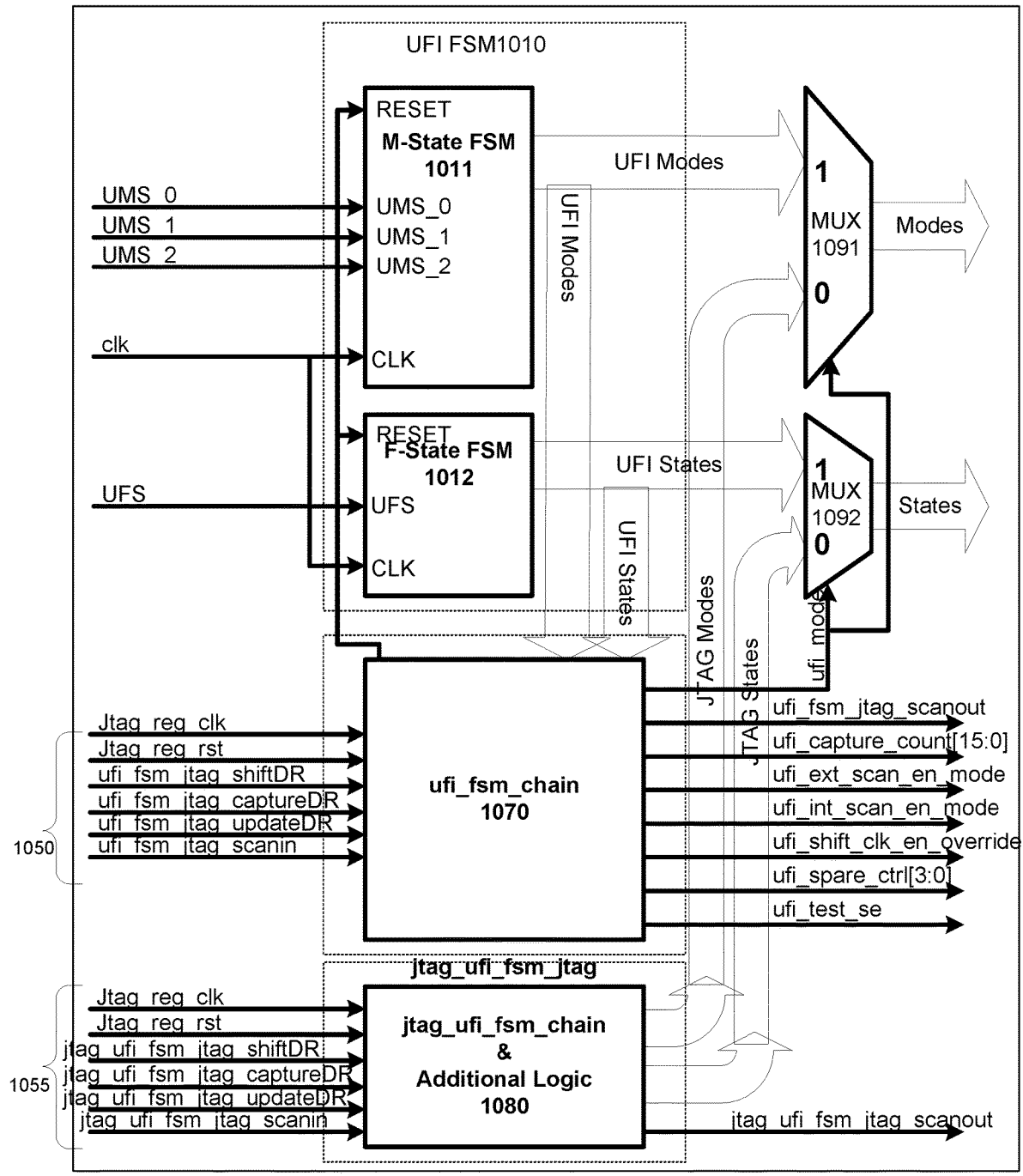
FIG. 10 is a block diagram of an exemplary UFI module in accordance with one embodiment.

FIG. 10 is a block diagram illustrating a combination ultra-fast-interface (UFI) module 1000, in accordance with one embodiment of the present disclosure. In particular, the simplified diagram of the UFI module 1000 is used to drive the centralized test controller (which performs the compression in a sequential scan architecture used for testing a chip at system level). In addition to UFI production testing, the present combination embodiment provide for using SSI to enable online logic testing at the system level. For example, sequential scan compression is implemented to achieve testing under reduced pin counts and improved test pattern quality when performing testing of a chip. UFI module 1000 can be implemented in two modes: (a) UFI mode for production testing using an ATE and, (b) SSI mode for system level or on line testing. As shown in FIG. 10 the UFI module 1000 includes a UFI state machine 1010, and SSI registers 1080. The SSI registers 1080 are used to reset, read, and write the controls signals required for the UFI module 1000. In particular, in the UFI mode, controls signals 1050 are generated using an external UFI scan pin (not shown). In one exemplary implementation in the SSI mode, control signals 1050 can also be generated using JTAG/1500 interface (not shown). In UFI mode controls signals are generated using external UFI scan pin. In JTAG mode control signals are generated using JTAG/1500 interface.

It is appreciated that granular dynamic test systems and methods can be coordinated with other test system operations. In one embodiment, Scan Serializer/Deserializer (SSD) is a time-division demultiplexing/multiplexing based scan architecture. It uses a small number of pins that interface with ATE and shift serial scan data at higher speeds. Load blocks or deserializers, are used before sending this data to Pseudo Scan Inputs (PSIs) at a lower frequency. Similarly Pseudo Scan Outputs (PSOs) send the scan data to unload blocks or serializers, before it reaches top level pins. In one exemplary implementation of an N:1 SSD ratio, an SSD fast clock runs at N times the speed of internal shift frequency.

With reference back to FIG. 2, in one embodiment, operations within a component of system 200 can be coordinated with various other components and features of system 200, external interfaces and components within a test partition. In one embodiment, a UFI and test clock generation is coordinated with DSTA serialization and deserialization operations.

Additional information regarding a Ultra Fast Interface (UFI) is set forth in related co-pending application Ser. No. 15/336,716, entitled Granular Dynamic Test Systems and Methods filed on Oct. 27, 2016, which is incorporated herein by reference.

Additional information regarding DSTA is set forth in related co-pending application Ser. No. 15/336,736, entitled Method and System for Dynamic Standard Test Access (DSTA) for a Logic Block Reuse filed on Oct. 27, 2016, which is incorporated herein by reference.

Additional information regarding coordination of external pad configuration is set forth in related co-pending application Ser. No. 15/336,687, entitled Test Partition External Input/Output Interface Control for Test Partitions in a Semiconductor filed on Oct. 27, 2016, which is incorporated herein by reference.

Additional information regarding on-line test operations and JTAG test operations is set forth in related co-pending application Ser. No. 15/336,747, entitled Scan System Interface (SSI) Module filed on Oct. 27, 2016, which is incorporated herein by reference.

Additional information regarding free running clock and independent test partition clock coordination is set forth in related co-pending application Ser. No. 15/336,626, entitled Dynamic Independent Test Partition Clocks filed on Oct. 27, 2016, which is incorporated herein by reference.

Additional information regarding test partition clock staggering and peak power reduction is set forth in related co-pending application Ser. No. 15/336,676, entitled Independent Test Partition Clock Coordination Across Multiple Test Partitions filed on Oct. 27, 2016, which is incorporated herein by reference.

The granular dynamic test systems and methods can be used in a variety of applications (e.g., CPUs, GPUs, mobile device SoCs, etc.). The granular dynamic test systems and methods can be used for both production testing and on-line testing. The production testing can be directed to finding manufacturing defects and the on-line testing can be directed to finding errors that develop after product shipment. The granular dynamic testing systems and methods support testing features for external testing (e.g., testing with Automatic Test Equipment (ATE)) as well as on system internal testing.

A granular dynamic test system and method can allow parallel testing of multiple test partitions in a given SoC. It also enables greater multi-site testing opportunities to further lower the test cost. The granular dynamic test systems and methods can include a dynamic test clock architecture that eliminates or reduces the interdependency in clocking across blocks and allows substantially concurrent yet independent testing of a block with its own pattern set. The granular dynamic test system and method architecture contributes to significant reduction of test application time by improving the scan shift frequency and efficiently utilizing the ATE resources by optimally scheduling various tests. The granular dynamic test system and method can facilitate faster time to market. The UFI can be compatible with standardized test interface allowing faster DFT cycles and efficient utilization of engineering resource (e.g., engineering time, software tool resources, etc.). The granular dynamic test system and method can also lower production test costs and test time by reducing cycle overhead and providing fast control access to centralized controller for sequential scan compression logic or other test controllers. The granular dynamic test system and method can be utilized in reuse friendly architecture (e.g., test partition design reuse, test pattern reuse, independence of DFT reuse from SOC test pin availability etc.).

In one embodiment, a test system comprises: a first test partition; a first external communication port configured to communicate with external components; and a first granular dynamic test interface configured to coordinate control of testing operations in the first test partition and communication of test information between the first external communication port and first test partition. The first granular dynamic test interface can be configurable to perform testing independent of test operations associated with other test partitions. The first granular dynamic test interface can be compatible with different types of testing. The first granular dynamic test interface has a first communication side and a second communication side, wherein the first communication side is associated with external communications and operates based upon a first clock rate, and the second communication side is associated with internal communications and operates based upon a second clock rate. The first clock rate can be faster than the second clock rate. The first granular dynamic test interface can be configurable to coordinate the second clock rate based upon the first clock rate. The first granular dynamic test interface can configurable to coordinate the second clock rate based different configurations of the external communication port.

In one embodiment, the first communication side of the first granular dynamic test interface receives test information related to test mode control and test state control from a single external pin included in the external communication port. The first granular dynamic test interface can be configured to coordinate control of testing operations in a second test partition and communication of test information between portions of the first external communication port, a second external communication port, and the second test partition. The test operations in the first test partition and the second test partition can be performed substantially in parallel or concurrently. In one exemplary implementation, the first granular dynamic test interface is dynamically configurable to receive test related information in a first test protocol format and a second test protocol format. The second test protocol can be a joint test action group (JTAG) compatible format and the first test protocol operates at a rate faster than the JTAG compatible format.

In one embodiment, a test system comprises a third test partition; a third external communication port configured to communicate with external components; and a third granular dynamic test interface configured to coordinate control of testing operations in the third test partition and communication of test information between the third external communication port and third test partition, wherein the first granular dynamic test interface and third granular dynamic test interface are configurable to perform testing independent of each other. Test operations in the first test partition and the third test partition can be performed substantially concurrently. In one exemplary implementation, the test operations in the first test partition are directed to a first type of testing and operations in the third test partition are directed to a second type of testing. The first type of testing and second type or testing can be selected from the group comprising Automatic Test Pattern Generation (ATPG) testing, Memory Built In Self Test (MBIST), and Input/Output Built In Self Test (IOBIST). The test operations in the first test partition and the third test partition can be performed at different clock rates.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical or quantum computing device) that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as suited to the particular use contemplated. It is intended that the scope of the invention be defined by the Claims appended hereto and their equivalents. The listing of steps within method claims do not imply any particular order to performing the steps, unless explicitly stated in the claim.

What is claimed:

1. A system comprising:
    a plurality of scan test chains configured to perform test operations on components in a circuit partition, wherein the scan test chains perform the test operations at a first clock speed;
    a central test controller for controlling the test operations by the scan test chains; and
    an interface configured to generate instructions that direct the central test controller, wherein the interface communicates with the central test controller at the first clock speed and an external scan input at a second clock speed, wherein the second clock speed is a faster frequency than the first clock speed.

2. The system of claim 1, wherein the first clock speed is a faster frequency than a test access port (TAP) clock (CLK) speed.

3. The system of claim 1, wherein the instructions that direct the central test controller includes directions associated with sequential scan compression/decompression operations.

4. The system of claim 1, wherein the instructions that direct the central test controller includes directions associated with combinational scan compression/decompression operations.

5. The system of claim 1, wherein the interface further comprises a mode state machine used to generate test mode control instructions and a test register state machine that generate test state control instructions, wherein the test mode control instructions and the test state control instructions direct operations of the centralized test controller.

6. The system of claim 1, wherein the interface operations are coordinated with a dynamic standard test access (DSTA) operation associated with test data input and test data output.

7. The system of claim 6, wherein the dynamic standard test access is coordinated with the second clock speed for communication of external data and the first clock speed for communication of internal data.

8. A test method comprising
    receiving external test information at an external communication rate;
    converting the external test information into control instructions for a central test controller; and
    communicating the control instructions to the central test controller in accordance with an internal communication rate, wherein the external communication rate is different than the internal communication rate, wherein a difference in the external communication rate and the internal communication rate is coordinated to compensate for differences between deserialization of the external test information and serialization of the control instructions.

9. The method of claim 8 wherein the external communication rate is a faster frequency than the internal communication rate.

10. The method of claim 8 wherein the converting comprises generating state instructions for the central test controller.

11. The method of claim 8 wherein the converting comprises generating mode instructions for the central test controller.

12. The method of claim 8 further comprising deserializing the external test information in which a single stream of the external test information is received at an external communication rate and a plurality of streams are forwarded at the internal communication rate.

13. The method of claim 8 wherein the control instructions are compatible with a type of testing and the type of testing is selected from the group comprising Automatic Test Pattern Generation (ATPG) testing, Memory Built In Self Test (MBIST), and Input/Output Built In Self Test (IOBIST).

14. The method of claim 8 wherein the converting is compatible with concurrent testing of multiple independent test partitions.

15. A system comprising:
    a plurality of functional components arranged in physical partitions;

a plurality of scan test chains configured to perform test operations on the plurality of functional components at a first clock speed;

a centralized test controller for controlling testing by the scan test chains; and an interface configured to communicate with the centralized test controller via external scan inputs at a second clock speed, wherein the second clock speed is a faster frequency than the first clock speed, wherein a difference in the first clock speed and the second clock is coordinated to compensate for deserialization of the external test information.

16. The system of claim 15 wherein:

each partition has a sequential compressor and de-compressor;

test data input has a corresponding deserializer; and test data output has a corresponding serializer.

17. The system of claim 15 wherein the interface facilitates independent management of the testing of the functional components.

18. The system of claim 17 wherein the interface facilitates concurrent testing across the physical partitions.

19. The system of claim 17 wherein the interface facilitates different types of testing across the physical partitions.

20. The system of claim 15 wherein the interface is a standardized test interface.

21. An interface device comprising:

a mode state machine configured to derive test mode control signals forwarded to a test partition central controller; and a test register state machine configured to derive test state control signals forwarded to the test partition central controller, and a deserializer that deserializes a stream of test related information from an external source into a mode state machine input and a test register state machine input, wherein a first input side of the deserializer receives test information communicated via an external communication port and a second output side of the deserializer forwards test information to the mode state machine and the test register state machine, wherein the first input side of the deserializer operates at a first clock rate and the second output side of the deserializer operates at a second clock rate, wherein the first clock rated is a faster frequency than the second clock rate.

22. The interface device of claim 21, wherein the test partition central controller is configured to coordinate test control information for test scan compression components and test scan decompression components.

23. The interface device of claim 21, wherein the test register state machine is driven by a data load serialize/deserialize component.

24. The interface device of claim 21, wherein the data load serialize/deserialize module is included in a dynamic standard test access (DTSA) component.

25. The interface device of claim 21, wherein the mode state machine and the test register state machine are in lock state.

* * * * *